(12) United States Patent
Kim

(10) Patent No.: US 8,966,338 B2
(45) Date of Patent: Feb. 24, 2015

(54) CYCLIC REDUNDANCY CHECK CODE GENERATING CIRCUIT, SEMICONDUCTOR MEMORY DEVICE, AND METHOD OF DRIVING SEMICONDUCTOR MEMORY DEVICE

(71) Applicant: Samsung Electronics Co., Ltd., Suwon-si (KR)

(72) Inventor: Kyung-hyun Kim, Suwon-si (KR)

(73) Assignee: Samsung Electronics Co., Ltd. (KR)

(*) Notice: Subject to any disclaimer, the term of this patent is extended or adjusted under 35 U.S.C. 154(b) by 190 days.

(21) Appl. No.: 13/666,560

(22) Filed: Nov. 1, 2012

(65) Prior Publication Data

US 2013/0124941 A1 May 16, 2013

Related U.S. Application Data

(62) Division of application No. 12/002,557, filed on Dec. 18, 2007, now Pat. No. 8,321,777.

(30) Foreign Application Priority Data

Dec. 28, 2006 (KR) .................. 10-2006-0136566

(51) Int. Cl.
*H03M 13/00* (2006.01)
*H03M 13/09* (2006.01)
(Continued)

(52) U.S. Cl.
CPC ........... *H03M 13/09* (2013.01); *G06F 11/1004* (2013.01); *H03M 13/1102* (2013.01);
(Continued)

(58) Field of Classification Search
CPC ... G06F 11/1004; G11C 29/42; H03M 13/09; H03M 13/1102; H03M 13/136; H03M 13/1515; H03M 13/19; H03M 13/2957

USPC ......................................... 714/758, 762, 801
See application file for complete search history.

(56) References Cited

U.S. PATENT DOCUMENTS 4,253,182 A 2/1981 Porcella
5,402,430 A * 3/1995 Asai et al. ................ 714/800
(Continued)

FOREIGN PATENT DOCUMENTS

JP 56-90500 7/1981
JP 60-77244 5/1985
(Continued)

OTHER PUBLICATIONS

Golic, J.D.;, "Iterative probabilistic decoding and parity checks with memory," Electronics Letters, vol. 35, No. 20, pp. 1721-1723, Sep. 30, 1999.*

(Continued)

*Primary Examiner* — Cynthia Britt
(74) *Attorney, Agent, or Firm* — Onello & Mello, LLP

(57) ABSTRACT

Disclosed are a semiconductor memory device, and a method of driving the same, and a cyclic redundancy check code generating circuit capable of performing cyclic redundancy check. A semiconductor memory device according to an aspect of the present invention includes a memory cell array, a data processing unit receiving data that is read from the memory cell array and selectively outputting at least some of the data according to ordering information, bit structure information, and burst length information, and a check code generating unit generating a cyclic redundancy check code to detect an error in the data being output, the check code generating unit generating and outputting the cyclic redundancy check code by using the read data, the ordering information, the bit structure information, and the burst length information.

8 Claims, 12 Drawing Sheets

(51) Int. Cl.
  *G06F 11/10* (2006.01)
  *H03M 13/11* (2006.01)
  *H03M 13/13* (2006.01)
  *H03M 13/15* (2006.01)
  *H03M 13/19* (2006.01)
  *H03M 13/29* (2006.01)

(52) U.S. Cl.
  CPC ......... *H03M13/136* (2013.01); *H03M 13/1515* (2013.01); *H03M 13/19* (2013.01); *H03M 13/2957* (2013.01)
  USPC .......................................... 714/758; 714/801

(56) References Cited

U.S. PATENT DOCUMENTS

| | | | |
|---|---|---|---|
| 6,049,903 A | | 4/2000 | Nishimura |
| 6,125,469 A | * | 9/2000 | Zook et al. .................... 714/769 |
| 6,415,355 B1 | * | 7/2002 | Hirofuji ........................ 711/114 |
| 6,445,717 B1 | * | 9/2002 | Gibson et al. ................ 370/473 |
| 7,712,007 B2 | * | 5/2010 | Nagai et al. ................... 714/754 |
| 8,140,938 B2 | * | 3/2012 | Ito et al. ........................ 714/763 |
| 2008/0163036 A1 | | 7/2008 | Kim |

FOREIGN PATENT DOCUMENTS

| | | |
|---|---|---|
| JP | 10-107650 | 4/1998 |
| JP | 2001-36414 | 2/2001 |
| JP | 2005-6188 | 1/2005 |

OTHER PUBLICATIONS

Golic, J.D., "Iterative probabilistic decoding and parity checks with memory," Electronic Letters, vol. 35, No. 20, pp. 1721-1723, Sep. 30, 1999.

"Cyclic Redundancy Check Code Generating Circuit, Semiconductor Memory Device, and Method of Driving Semiconductor Memory Device" Specification, Drawings, and Prosecution History, of U.S. Appl. No. 12/002,557, filed Dec. 18, 2007, by Kyung-hyun Kim, which is stored in the United States Patent and Trademark Office (USPTO) system.

* cited by examiner

FIG. 4A

| D0 | D1 | D2 | D3 | D4 | D5 | D6 | D7 |
|----|----|----|----|----|----|----|----|
| d0 | d16 | d32 | d48 | d64 | d80 | d96 | d112 |
| d1 | d17 | d33 | d49 | d65 |  |  | d113 |
| d2 | d18 | d34 | d50 | d66 |  |  | d114 |
| d3 | d19 | d35 | d51 | d67 |  |  | d115 |
| d4 | d20 | d36 | d52 | d68 |  |  | d116 |
| d5 | d21 | d37 | d53 | d69 | . | . | d117 |
| d6 | d22 | d38 | d54 | d70 | . | . | d118 |
| d7 | d23 | d39 | d55 | d71 | . | . | d119 |
| d8 | d24 | d40 | d56 | d72 | . | . | d120 |
| d9 | d25 | d41 | d57 | d73 |  |  | d121 |
| d10 | d26 | d42 | d58 | d74 |  |  | d122 |
| d11 | d27 | d43 | d59 | d75 |  |  | d123 |
| d12 | d28 | d44 | d60 | d76 |  |  | d124 |
| d13 | d29 | d45 | d61 | d77 |  |  | d125 |
| d14 | d30 | d46 | d62 | d78 |  |  | d126 |
| d15 | d31 | d47 | d63 | d79 | d95 | d111 | d127 |

$$\left( \begin{array}{c} \text{dividend}: d0 \sim d127 0 \sim 0 \\ \underbrace{\phantom{xxxxxx}}_{D1 \sim D7} \end{array} \right)$$

BL : 8
ORD : 000
BO : X16

CRC[0] : d0+d8+d17

$\vdots$

CRC[7] : d1+d31+d127

| BL | ORD(A2A1A0) | DATA ORDER |
|---|---|---|
| 4 | 000 | D0, D1, D2, D3 |
|   | 001 | D1, D2, D3, D0 |
|   | 010 | D2, D3, D0, D1 |
|   | 011 | D3, D0, D1, D2 |
| 8 | 000 | D0, D1, D2, D3, D4, D5, D6, D7 |
|   | 001 | D1, D2, D3, D0, D5, D6, D7, D4 |
|   | 010 | D2, D3, D0, D1, D6, D7, D4, D5 |
|   | 011 | D3, D0, D1, D2, D7, D4, D5, D6 |
|   | 100 | D4, D5, D6, D7, D0, D1, D2, D3 |
|   | 101 | D5, D6, D7, D4, D1, D2, D3, D0 |
|   | 110 | D6, D7, D4, D5, D2, D3, D0, D1 |
|   | 111 | D7, D4, D5, D6, D3, D0, D1, D2 |

| D1 | D2 | D3 | D0 | D5 | D6 | D7 | D4 |
|---|---|---|---|---|---|---|---|
| d16 | d32 | d48 | d0 | d80 | d96 | d112 | d64 |
| d17 | d33 | d49 | d1 | | | d113 | d65 |
| d18 | d34 | d50 | d2 | | | d114 | d66 |
| d19 | d35 | d51 | d3 | | | d115 | d67 |
| d20 | d36 | d52 | d4 | | | d116 | d68 |
| d21 | d37 | d53 | d5 | . | . | d117 | d69 |
| d22 | d38 | d54 | d6 | . | . | d118 | d70 |
| d23 | d39 | d55 | d7 | . | . | d119 | d71 |
| d24 | d40 | d56 | d8 | . | . | d120 | d72 |
| d25 | d41 | d57 | d9 | | | d121 | d73 |
| d26 | d42 | d58 | d10 | | | d122 | d74 |
| d27 | d43 | d59 | d11 | | | d123 | d75 |
| d28 | d44 | d60 | d12 | | | d124 | d76 |
| d29 | d45 | d61 | d13 | | | d125 | d77 |
| d30 | d46 | d62 | d14 | | | d126 | d78 |
| d31 | d47 | d63 | d15 | d95 | d111 | d127 | d79 |

BL : 8
ORD : 001
BO : X16

CRC[0] : d16+d24+d33

⋮

CRC[7] : d17+d47+d79

$\left( \text{dividend : } \underbrace{d16 \sim d63}_{D1 \sim D3} \underbrace{d0 \sim d15}_{D0} \underbrace{d80 \sim d127}_{D5 \sim D7} \underbrace{d64 \sim d79}_{D4} 0 \sim 0 \right)$

FIG. 6A

| D0 | D1 | D2 | D3 |
|----|----|----|----|
| d0 | d16 | d32 | d48 |
| d1 | d17 | d33 | d49 |
| d2 | d18 | d34 | d50 |
| d3 | d19 | d35 | d51 |
| d4 | d20 | d36 | d52 |
| d5 | d21 | d37 | d53 |
| d6 | d22 | d38 | d54 |
| d7 | d23 | d39 | d55 |
| d8 | d24 | d40 | d56 |
| d9 | d25 | d41 | d57 |
| d10 | d26 | d42 | d58 |
| d11 | d27 | d43 | d59 |
| d12 | d28 | d44 | d60 |
| d13 | d29 | d45 | d61 |
| d14 | d30 | d46 | d62 |
| d15 | d31 | d47 | d63 |

BL : 4
ORD : 000
BO : X8

CRC[0] : d0+d17

$\vdots$

CRC[7] : d1

$$\left( \text{dividend} : \underbrace{d0 \sim d7 0 \sim 0}_{D0} \underbrace{d16 \sim d23 0 \sim 0}_{D1} \underbrace{d32 \sim d39 0 \sim 0}_{D2} \underbrace{d48 \sim d55}_{D3} \underbrace{0 \sim 0 0 \sim 0}_{D4 \sim D7} \right)$$

US 8,966,338 B2

CYCLIC REDUNDANCY CHECK CODE GENERATING CIRCUIT, SEMICONDUCTOR MEMORY DEVICE, AND METHOD OF DRIVING SEMICONDUCTOR MEMORY DEVICE

CROSS REFERENCE TO RELATED APPLICATION

This application is a divisional application of U.S. patent application Ser. No. 12/002,557, filed on Dec. 18, 2007, now U.S. Pat. No. 8,321,777, issued on Nov. 27, 2012, which claims the benefit of Korean Patent Application No. 10-2006-0136566 filed on Dec. 28, 2006, in the Korean Intellectual Property Office, the contents of which applications are incorporated herein in their entirety by reference.

BACKGROUND OF THE INVENTION

1. Field of the Invention

The present invention relates to a cyclic redundancy check code generating circuit, a semiconductor memory device, and a method of driving a semiconductor memory device.

2. Description of the Related Art

Memories transmit data to memory controllers. As the amount of data transmitted increases, a bit error rate (BER) increases. Therefore, reliability of data that is transmitted between the memory and the memory controller has become an important issue. In order to detect an error in the data being transmitted, various methods of detecting errors have been applied to semiconductor memory devices.

However, since it takes time to generate an error detection code so as to detect an error and transmit the generated error detection code, it is difficult to improve an increase in an operating speed of the semiconductor memory device.

SUMMARY OF THE INVENTION

In accordance with the present invention there is provided a cyclic redundancy check code generating circuit that improves reliability of data, but does not reduce an operating speed of a semiconductor memory device.

Also in accordance with the present invention there is provided a semiconductor memory device that improves reliability of data but does not reduce an operating speed of the semiconductor memory device.

Also in accordance with the present invention there is provided a method of driving a semiconductor memory device that improves reliability of data but does not reduce an operating speed of the semiconductor memory device.

The present invention is not limited to those aspects mentioned above, other aspects of the present invention will be apparent to those skilled in the art.

According to a first aspect of the present invention, there is provided a semiconductor memory device including a memory cell array, a data processing unit configured to receive data that is read from the memory cell array and to selectively output at least some of the data according to ordering information, bit structure information, and burst length information, and a check code generating unit configured to generate a cyclic redundancy check code to detect an error in the data being output, the check code generating unit configured to generate and output the cyclic redundancy check code using the read data, the ordering information, the bit structure information, and the burst length information.

Individual bits of the cyclic redundancy check code can be generated by adding the data selected from the read data.

When the cyclic redundancy check code has k bits, the check code generating unit can comprise: first to k-th selecting signal generating units configured to generate selecting signals corresponding to the ordering information, the bit structure information, and the burst length information; first to k-th selecting units configured to receive selecting signals from the first to k-th selecting signal generating units, respectively, and to select some data from the read data; and first to k-th adding units configured to add the selected data so as to generate the individual bits of the cyclic redundancy check code.

Each of the first to k-th selecting units can comprise an AND gate (AND) that receives the selecting signals and the read data, and each of the first to k-th adding units can comprise an exclusive OR gate (XOR) that receives an output of the AND gate and adds that output to the selected data.

The semiconductor memory device of claim 1, can further comprise: data output pins through which the data is output and a check code pin through which the cyclic redundancy check code is output.

The burst length and length of the cyclic redundancy check code can be the same.

The data and the cyclic redundancy check code can be output at substantially the same time.

The data processing unit can comprise: an ordering unit configured to order the read data according to the ordering information and the burst length information; and a switching unit configured to receive the bit structure information and the burst length information and to output the selected data.

According to a second aspect of the present invention, there is provided a semiconductor memory device including a memory cell array, a data processing unit configured to process data that is read from the memory cell array according to input/output mode information, and to selectively output at least some of the data, and a check code generating unit configured to generate a check code to detect an error in the data being output, the check code generating unit configured to generate the check code using the input/output mode information, and to output the generated check code.

The input/output mode information can comprise ordering information, bit structure information, and burst length information. And the data processing unit can comprise: an ordering unit configured to order the read data according to the ordering information and the burst length information; and a switching unit configured to select and output at least some of the ordered data according to the bit structure information and the burst length information.

The check code can be a cyclic redundancy check code for cyclic redundancy check.

The individual bits of the check code can be generated by adding data that is selected from the read data.

When the check code has k bits, and the check code generating unit can comprise: first to k-th selecting signal generating units configured to individually supply selecting signals according to the input/output mode information; first to k-th selecting units configured to receive selecting signals from the first to k-th selecting signal generating units, respectively, and to select some of the read data; and first to k-th adding units configured to add the selected data and to generate the individual bits of the check code.

Each of the first to k-th selecting units can comprise an AND gate (AND) that receives the selecting signals and the data, and each of the first to k-th adding units comprises an exclusive OR gate (XOR) that receives an output of the AND gate (AND) and adds that output to the selected data.

The semiconductor memory device can further comprise: data output pins through which the data is output and a check code pin through which the check code is output.

The burst length and length of the check code can be the same.

The data and the check code can be output at substantially the same time.

According to a third aspect of the present invention, there is provided a cyclic redundancy check code generating circuit including selecting signal generating units configured to supply selecting signals corresponding to input/output mode information, selecting units configured to receive the selecting signals from the selecting signal generating units and to select some of the data being input, and adding units configured to add the selected data and to generate a cyclic redundancy check code.

The input/output mode information can comprise ordering information, bit structure information, and burst length information of the semiconductor memory device.

Each of the selecting units can comprise an AND gate that receives the selecting signals and the data, and each of the adding units comprises an exclusive OR gate (XOR) that receives an output of the AND gate and adds that output to the selected data.

According to a fourth aspect of the present invention, there is provided a method of driving a semiconductor memory device, the method including reading data from a memory cell array and supplying the read data to a data processing unit and a check code generating unit, causing the data processing unit to process the read data according to input/output mode information and the check code generating unit to generate a check code according to the input/output mode information to detect an error in the read data, and outputting the processed data and the check code.

The input/output mode information can comprise ordering information, bit structure information, and burst length information.

The check code can be a cyclic redundancy check code for cyclic redundancy check.

The processed data and the check code can be output at substantially the same time.

BRIEF DESCRIPTION OF THE DRAWINGS

The above and other aspects of the present invention will become more apparent by describing in detail preferred embodiments thereof with reference to the attached drawings, in which:

FIG. 4A is a view illustrating an embodiment of the operation of a semiconductor memory device according to first input/output mode information, according to an aspect of the present invention;

FIG. 6A is a view illustrating an embodiment of the operation of the semiconductor memory device according to third input/output mode information;

DESCRIPTION OF THE PREFERRED EMBODIMENTS

Advantages and features of the present invention and methods of accomplishing the same can be understood more readily by reference to the following detailed description of preferred embodiments and the accompanying drawings. The present invention can, however, be embodied in many different forms and should not be construed as being limited to the embodiments set forth herein. Further, for convenience of explanation, a "circuit" and a "unit" used hereinafter can be used interchangeably.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, steps, operations, elements, and/or components, but do not preclude the presence or addition of one or more other features, steps, operations, elements, components, and/or groups thereof. As used herein, the term "and/or" includes any and all combinations of one or more of the associated listed items.

Aspects of the present invention will now be described more fully with reference to the accompanying drawings, in which preferred embodiments of the invention are shown.

Figure 1:
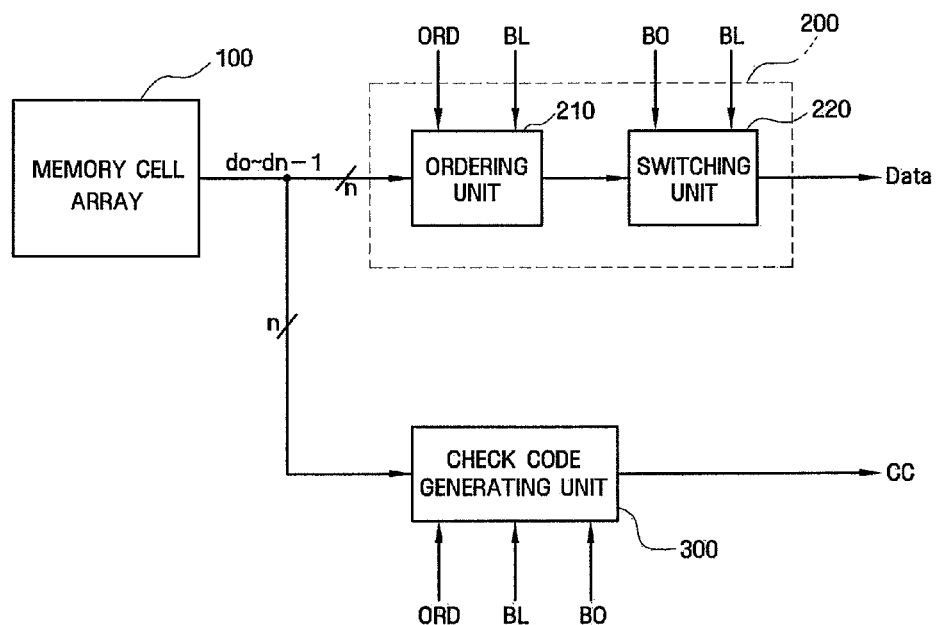
FIG. 1 is a schematic block diagram illustrating an embodiment of a semiconductor memory device and an embodiment of a method of driving the same according to aspects of the present invention.

A semiconductor memory device and a method of driving the same according to aspects of the present invention will now be described with reference to FIG. 1. FIG. 1 is a schematic block diagram illustrating an embodiment of a semiconductor memory device, from which can be described an embodiment of a method of driving the same.

Referring to FIG. 1, a semiconductor memory device 10 includes a memory cell array 100, a data processing unit 200, and a check code generating unit 300. The data processing unit 200 can include an ordering unit 210 and a switching unit 220. Hereinafter, an illustrative case will be described in which data d0 to dn−1 that is read from the memory cell array 100 passes through the ordering unit 210 and is supplied to the switching unit 220. In embodiments other than FIG. 1, the data d0 to dn−1 that are read from the memory cell array 100 can pass through the switching unit 220 and then be supplied to the ordering unit 210, and the semiconductor memory device 10 can include only one of the ordering unit 210 and the switching unit 220.

In response to an address signal and a read command signal, the data d0 to dn−1 are read from the memory cell array 100, and the read data d0 to dn−1 are supplied to the data processing unit 200 and the check code generating unit 300 through "n" data channels.

The data processing unit 200 processes the read data d0 to dn−1 according to input/output mode information BL, ORD, and BO and outputs the processed data. Here, the input/output mode information BL, ORD, and BO can be burst length information BL, ordering information ORD, and bit structure information BO. That is, the data processing unit 200 orders the read data d0 to dn−1 according to the ordering information ORD and the burst length information BL and selectively outputs some of the ordered data according to the bit structure information BO. Here, the ordering information ORD refers to an order in which data is input and output, and the bit structure information BO can be one of ×4, ×8, and ×16.

The check code generating unit 300 generates a check code CC to detect an error in data that is output and transmitted from the data processing unit 200. Alternatively, the check code generating unit 300 generates a check code to detect an error in data to be written in the memory cell array 100, that is, the transmitted data. When an error in the transmitted data is detected, if a check code for the transmitted data is generated and then the check code is transmitted to a transmitter side that has transmitted the data, the transmitter side determines whether there is an error in the data transmission. A method of generating the check code CC for the data is the same when data d0 to dn−1 read from the memory cell array 100 are transmitted and when data is received so that the data is written in the memory cell array 100. Therefore, hereinafter, a description will be made of a case in which the data d0 to dn−1 read from the memory cell array 100 are transmitted.

The check code generating unit 300 generates the check code CC by using the read data and the input/output mode information BL, ORD, and BO. Here, the check code CC is a code for detecting an error in data, and examples of the check code CC can include a hamming code, a Huffman code, a parity bit, a turbo code, a low-density parity-check code, a Reed-Muller code, a Reed-Solomon error correction code, and a Cyclic Redundancy Check (hereinafter, simply referred to as "CRC") code, each of which is generally known in the art.

The check code generating unit 300 generates the check code CC for detecting an error in the data while the data processing unit 200 processes the read data d0 to dn−1 according to the input/output mode information BL, ORD, and BO. Therefore, additional time is not required to generate the check code CC, and an operating speed of the semiconductor memory device 10 is not be affected. That is, while the operating speed of the semiconductor memory device 10 is not reduced, the reliability of data can be ensured.

Further, the semiconductor memory device 10 can include a check code pin (not shown) in addition to input/output pins (not shown) through which data is input and output. The data and the check code CC can be output at the same time through each of the pins. Further, according to the type of check code CC, the length of the data that is output through each of the pins can be the same as that of the check code CC.

Hereinafter, the description will be made of a case in which a CRC code is used as the check code for detecting an error in data, and the check code generating unit 300 of FIG. 1 is a CRC code generating unit. However, the present invention is not limited thereto.

Figure 2:
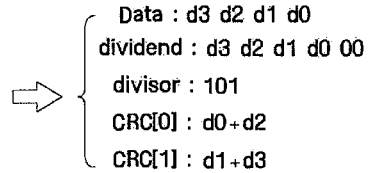
FIG. 2 is a view illustrating the concept of cyclic redundancy check (CRC)
Figure 3:
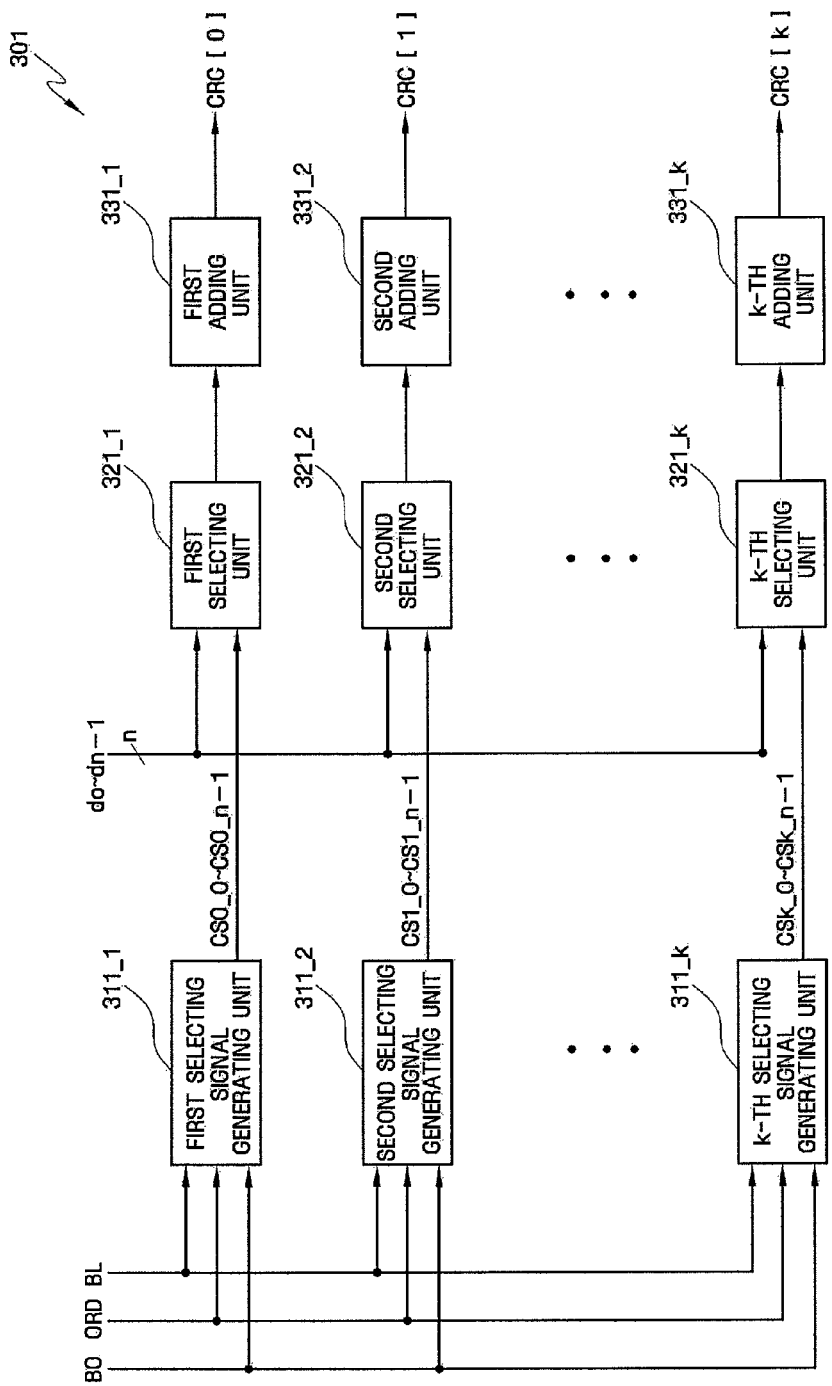
FIG. 3 is a block diagram illustrating an embodiment of a CRC code generating circuit according to an aspect of the present invention.

A CRC code generating unit, a semiconductor memory device having the CRC code generating unit, and a method of driving the semiconductor memory device according to one embodiment of the present invention will be described with reference to FIGS. 2 and 3. FIG. 2 is a view illustrating the concept of cyclic redundancy check CRC. FIG. 3 is a block diagram illustrating an embodiment of a CRC code generating circuit according to an aspect of the present invention.

First, the concept of the CRC will be described in brief. In an apparatus or a system that transmits and receives data, in order to detect whether the data is transmitted without causing errors, a transmitting unit generates a CRC code corresponding to the data and transmits the CRC code and the data, and a receiving unit receives the data and the CRC code to detect whether or not errors have occurred. Here, the CRC code is a remainder obtained by dividing data to be transmitted by a divisor that is predetermined beforehand between the transmitting unit and the receiving unit. That is, after the data is divided by a predetermined divisor, a remainder is transmitted together with the data. The receiving unit adds the data and the remainder, and divides the added result by the divisor, such that the receiving unit determines whether errors have occurred in the data transmission or not according to the remainder. That is, when the divided result is 0, the data is transmitted without errors, and when the added result cannot be divided by the divisor, errors have occurred when the data is transmitted.

Referring to FIG. 2, the CRC code will be described in more detail. For example, four data to be transmitted have 4 bits, d3d2d1d0, and each of the four data has 1 bit, and a divisor that is predetermined beforehand between the receiving unit and the transmitting unit is 101, which has 3 bits. Two zeros (0) in the form of 2 bits that are 1 bit smaller than the divisor are attached to the 4-bit data to be transmitted. That is, d3d2d1d0 00 becomes a dividend. When the dividend is divided by the divisor, as shown in FIG. 2, a remainder is d1+d3 d0+d2. The remainder becomes a CRC code. That is, the CRC code is determined according to the divisor. Individual bits (i.e., CRC[0] and CRC[1]) of the CRC code are expressed by sums of the data (d0 and d2, and d1 and d3) selected from the data d3d2d1d0 to be transmitted.

The receiving unit adds the CRC code CRC[0] and CRC[1] to the transmitted data d3d2d1d0, and divides the added result by the previously set divisor 101, such that the receiving unit determines whether errors have occurred in the transmission of the data d3d2d1d0 according to a remainder.

The embodiment of the CRC code generating circuit will be described with reference to FIG. 3.

As described above, when the divisor is determined, individual bits CRC[0] to CRC[k] of the CRC code are determined by sums of data selected from the read data. A CRC code generating circuit 301 generates individual bits CRC[0] to CRC[k] of the CRC code by selecting some of the data from the read data and adding the selected data. Here, in order to select some of the read data, the CRC code generating circuit 301, as an embodiment of the check code generating unit 300 of FIG. 1, uses input/output mode information BL, ORD, and BO.

More specifically, the CRC code generating circuit 301 includes selecting signal generating units 311_1 to 311_k, selecting units 321_1 to 321_k, and adding units 331_1 to 331_k, respectively. For example, when the CRC codes CRC[0] to CRC[k] have k bits, the CRC code generating circuit 301 includes first to k-th selecting signal generating units 311_1 to 311_k, first to k-th selecting units 321_1 to 321_k, and first to k-th adding units 331_1 to 331_k.

Each of the first to k-th selecting signal generating units 311_1 to 311_k is supplied with the input/output mode information BL, ORD, and BO, for example, burst length information BL, ordering information ORD, and bit structure information BO. The first to k-th selecting signal generating units 311_1 to 311_k supply selecting signals CS0_0 to CS0_n−1, CS1_0 to CS1_n−1, and CSk_0 to CSk_n−1, respectively. The selecting signals CS0_0 to CS0_n−1, CS1_0 to CS1_n−1, and CSk_0 to CSk_n−1 are signals for selecting some of the data from n data that is read. For example, the first selecting signals CS0_0 to CS0_n−1 are signals for selecting data necessary when generating the lowest significant bit CRC[0] of the CRC code from among the n data d0 to dn−1 that are read. The k-th selecting signals CSk_0 to CSk_n−1 are signals for selecting data necessary when generating the highest significant bit CRC[k] of the CRC code from among the n data d0 to dn−1 that are read.

The first to k-th selecting units 321_1 to 321_k are supplied with the n read data d0 to dn−1, and the selecting signals CS0_0 to CS0_n−1, CS1_0 to CS1_n−1, and CSk_0 to CSk_n−1, respectively, select some of the data from the n data d0 to dn−1 according to the selecting signals CS0_0 to CS0_n−1, CS1_0 to CS1_n−1, and CSk_0 to CSk_n−1, and supply the selected data to the first to k-th adding units 331_1 to 331_k, respectively. Each of the first to k-th selecting units 321_1 to 321_k can include an AND gate (not shown) that receives the data d0 to dn−1 and each of the selecting signals CS0_0 to CS0_n−1, CS1_0 to CS1_n−1, and CSk_0 to CSk_n−1.

The first to k-th adding units 331_1 to 331_k each add the selected data and output respective individual bits CRC[0] to CRC[k] of the CRC code. Each of the first to k-th adding units 331_1 to 331_k can include an exclusive OR gate that receives output of each of the first to k-th adding units 331_1 to 331_k.

Hereinafter, an embodiment of the operation of a semiconductor memory device that includes the above-described CRC code generating unit 301 according to the input/output mode information BL, ORD, and BO will be described using specific examples.

Figures 4B, 4C:
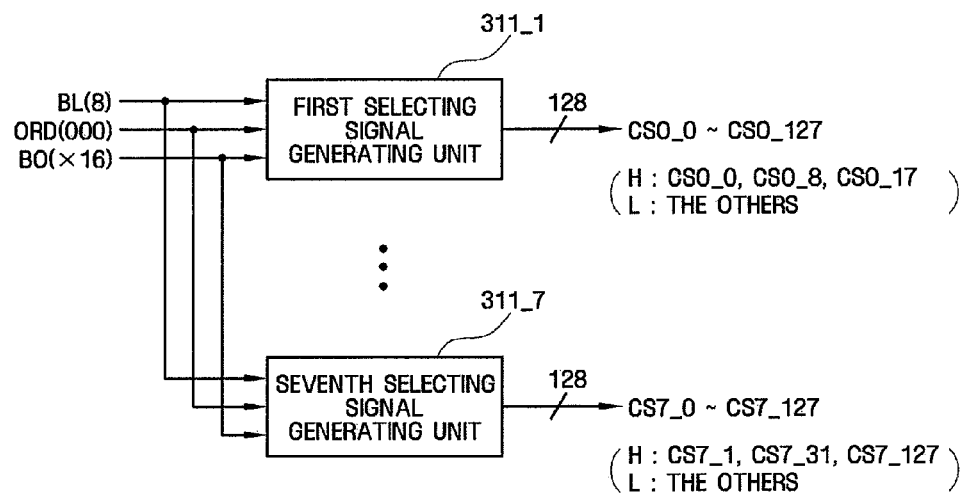
FIG. 4B is a view showing an embodiment of a burst mode specification for illustrating an embodiment of an ordering unit.
FIG. 4C is a block diagram illustrating embodiments of selecting signal generating units according to the first input/output mode information.
Figure 4D:
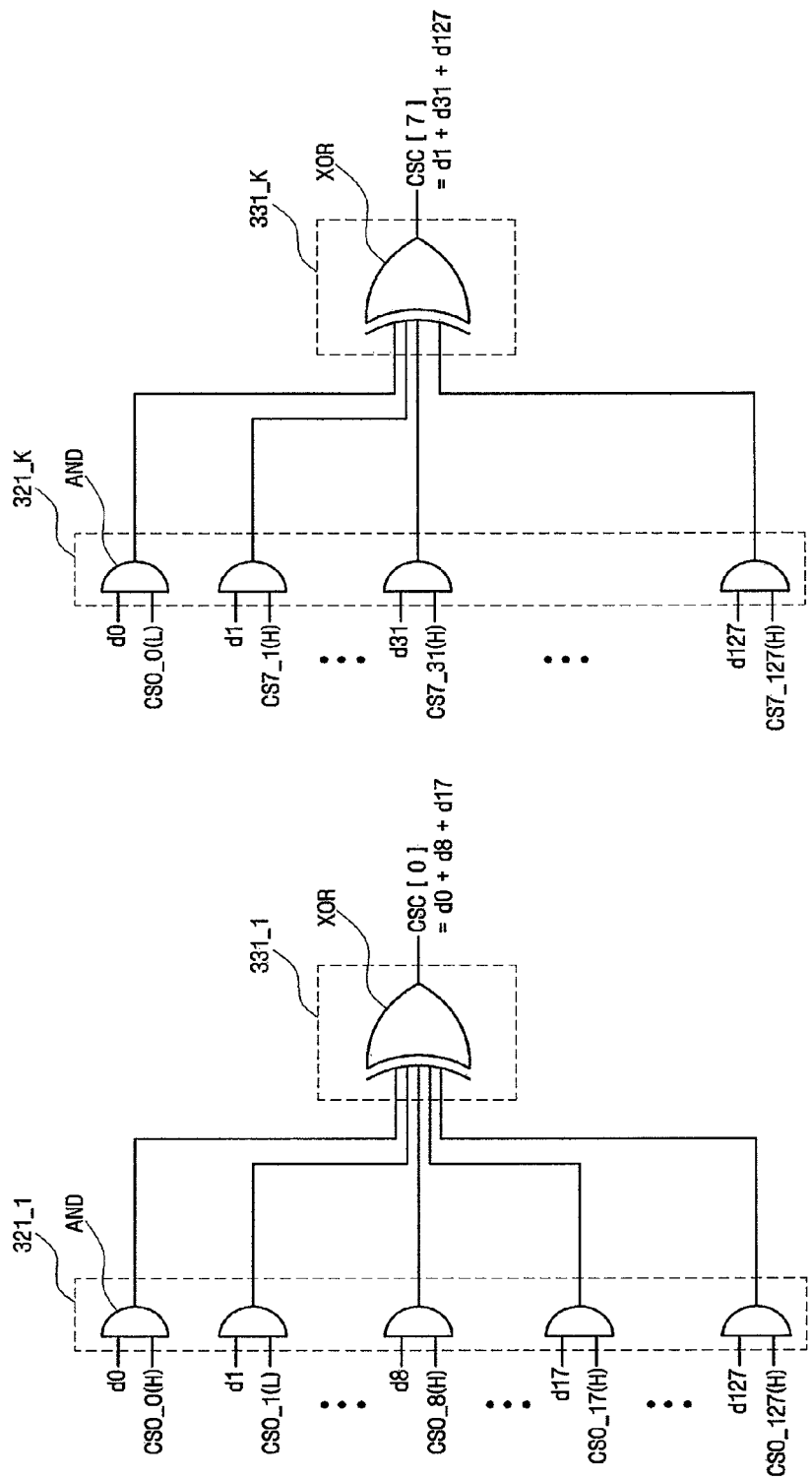
FIG. 4D is a block diagram illustrating embodiments of selecting units and adding units according to the first input/output mode information.

First, referring to FIGS. 1, and 4A to 4D, the operation of the semiconductor memory device will be described in detail on the assumption that, as first input/output mode information, burst length information BL is 8, ordering information ORD is 000, and bit structure information BO is ×16. FIG. 4A is a view illustrating an embodiment of the operation of a semiconductor memory device according to input/output mode information according to an aspect of the present invention. FIG. 4B is a view showing burst mode specification for illustrating an embodiment of an ordering unit. FIG. 4C is a block diagram illustrating an embodiment of selecting signal generating units according to first input/output mode information. FIG. 4D is a block diagram illustrating embodiments of selecting units and adding units according to the first input/output mode information. For convenience of explanation, the description will be made for a case in which the check code generating unit of FIG. 1 is a CRC code generating unit, e.g., CRC code generating unit 301 as in FIG. 3.

First, the operation of the data processing unit 200 will be described.

Since the burst length information BL is 8, for example, as shown in FIG. 4A, 128 data d0 to d127 are read from the memory cell array 100. The ordering unit 210 orders the 128 data d0 to d127 according to the burst length information BL and the ordering information ORD. Here, the ordering unit 210 can order the 128 data d0 to d127 in the units of D0, D1, D2, D3, D4, D5, D6, and D7. FIG. 4B shows a burst mode specification for ordering data in a general semiconductor memory device. That is, according to the burst mode specification shown in FIG. 4B, when the burst length is 8 and ordering information ORD is 000, the 128 data d0 to d127 are ordered in the order of D0, D1, D2, D3, D4, D5, D6, and D7 and supplied to the switching unit 220. Since the bit structure information BO is ×16 and the burst length information BL is 8, the switching unit 220 selects all of 128 data d0 to d127 that are input in parallel to each other, and outputs D0, D1, D2, D3, D4, D5, D6, and D7 through 16 data input/output pins (not shown).

Next, the operation of the CRC code generating unit 301 will be described.

While the data processing unit 200 is processing the 128 data d0 to d127 that are read, the CRC code generating unit 301 generates CRC code CRC[0] to CRC[7] by using the 128 data d0 to d127 and the input/output mode information BL, ORD, and BO. That is, when the burst length information BL is 8, the ordering information ORD is 000, and the bit structure information BO is ×16, for example, as shown in FIG. 4A, the bits CRC[0] to CRC[7] of the CRC code are determined as sums of some of the data selected from among the 128 data d0 to d127. That is, when the CRC code has 8 bits, the lowest significant bit CRC[0] of the CRC code is determined as a sum of the data d0, d8, and d17, and the highest significant bit CRC[7] of the CRC code is determined as sum of the data d1, d31, and d127.

The bits CRC[0] to CRC[7] of the CRC code are determined according to the principle that has been described with reference to FIG. 2. That is, when the burst length information BL is 8, the ordering information ORD is 000, and the bit structure information BO is ×16, transmitted data become D0, D1, D2, D3, D4, D5, D6, and D7 (or d0, d1, d2, ..., and d127). Here, a dividend can be regarded as d0~d127 0~0. In this case, the CRC code can be determined, as shown in FIG. 4A. In other words, the CRC code is determined by a combination of the burst length information BL, the ordering information ORD, and the bit structure information BO.

In order to generate the CRC code that is determined according to the burst length information BL, the ordering information ORD, and the bit structure information BO, as shown in FIG. 3, the selecting signal generating units 311_1 to 311_k output selecting signals by using the read data d0 to d127, the burst length information BL, the ordering information ORD, and the bit structure information BO. At this time, since the CRC code is determined by the combination of the burst length information BL, the ordering information ORD, and the bit structure information BO, each of the first to seventh selecting signal generating units 311_1 to 311_7 can have therein a logic circuit that outputs predetermined data by the combination of the burst length information BL, the ordering information ORD, and the bit structure information BO. The logic circuit can be easily realized by those skilled in the art using a logic operator, such as an AND gate and an OR gate.

That is, when the burst length information BL is 8, the ordering information ORD is 000, and the bit structure information BO is ×16, the first selecting signal generating unit 311_1 outputs selecting signals CS0_0, CS0_8, and CS0_17 at a high level and the other selecting signals (the rest) at a low level. The seventh selecting signal generating unit 311_7 outputs selecting signals CS7_1, CS7_31, and CS7_127 at a high level and the other selecting signals (the rest) at a low level when the burst length information BL is 8, the ordering information ORD is 000, and the bit structure information BO is ×16.

When the selecting signals are supplied from the first to seventh selecting signal generating units 311_1 to 311_7, as shown in FIG. 4C, predetermined data is selected from among the 128 data d0 to d127 and supplied to the first to seventh adding units. That is, the first selecting unit 321_1 receives the selecting signals CS0_0, CS0_1, CS0_8, CS0_17, and CS0_127, and the 128 data d0 to d127 and selects the data d0, d8 and d17. The seventh selecting units 321_7 receives the selecting signals CS7_0, CS7_1, CS7_31, and CS7_127, and the 128 data d0 to d127 and selects the data d1, d31, and d127. The first to seventh selecting units 321_1 to 321_7 each includes, for example, an AND gate AND, and can select the data d0, d8, and d17 or d1, d31 and d127 according to the selecting signals CS0_0, CS0_8, and CS0_17 or CS7_1 CS7_31, and CS7_127 at a high level.

The first adding unit 331_1 adds the data d0, d8, and d17 that are selected from the first selecting unit 321_1, and outputs the lowest significant bit CRC[0] of the CRC code. The seventh adding unit 331_7 adds the data d1, d31, and d127 that are selected by the seventh selecting unit 321_7, and outputs the highest significant bit CRC[7] of the CRC code. Each of the first to seventh adding units 331_1 to 331_7 can include, for example, an exclusive OR gate (XOR).

Figures 5A, 5B:
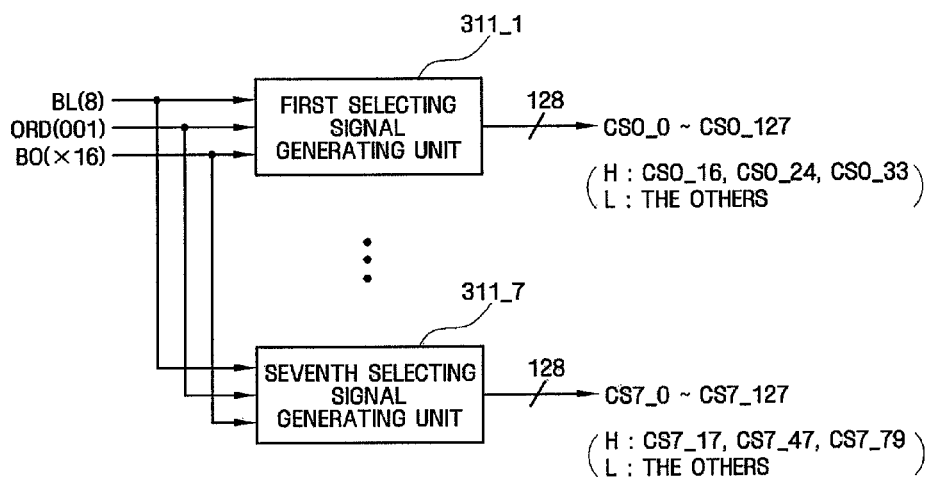
FIG. 5A is a view illustrating an embodiment of the operation of the semiconductor memory device according to second input/output mode information.
FIG. 5B is a block diagram illustrating embodiments of selecting signal generating units according to the second input/output mode information.
Figure 5C:
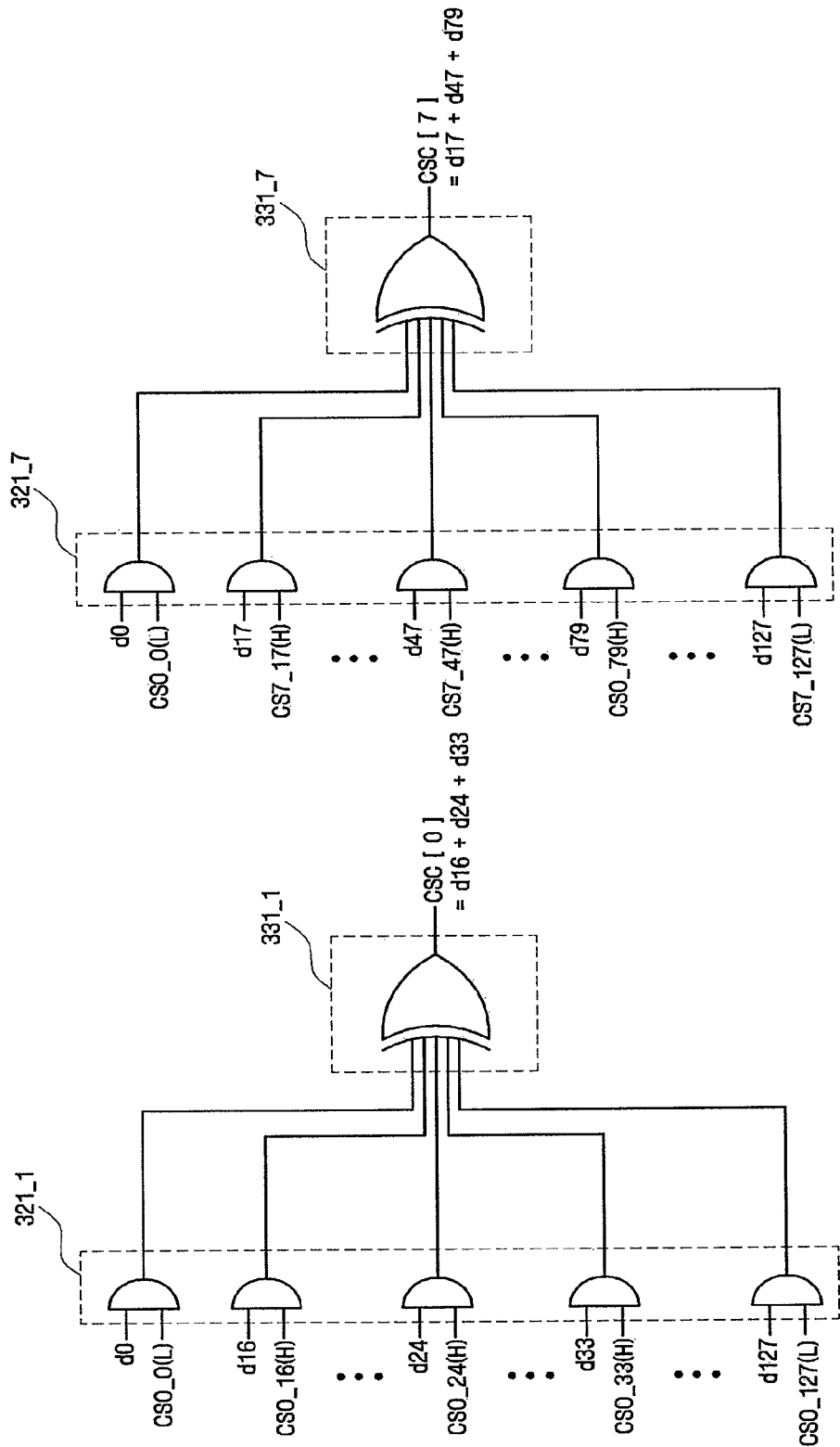
FIG. 5C is a block diagram illustrating embodiments of selecting units and adding units according to the second input/output mode information.

Next, an embodiment of the operation of the semiconductor memory device will be described in detail with reference to FIGS. 1, and 5A to 5C on the assumption that, as second input/output mode information, burst length information BL is 8, ordering information ORD is 001, and bit structure information BO is ×16. FIG. 5A is a view illustrating an embodiment of the operation of the semiconductor memory device according to second input/output mode information. FIG. 5B is a block diagram illustrating an embodiment of selecting signal generating units according to second input/output mode information. FIG. 5C is a block diagram illustrating embodiments of selecting units and adding units according to the second input/output mode information. For convenience of explanation, the description will be made for a case in which the check code generating unit 300 of FIG. 1 is a CRC code generating unit, e.g., CRC code generating unit 301 as in FIG. 3. For convenience of explanation, parts having the same functions as those in the above-described embodiment FIGS. 4A to 4D are represented by the same reference numerals, and thus the descriptions thereof will be omitted here.

First, the operation of the data processing unit 200 will be described.

Since the burst length information BL is 8, for example, when 128 data d0 to d127 are read from the memory cell array 100, the ordering unit 210 orders the 128 data d0 to d127 according to the burst length information BL and the ordering information ORD. Since the burst length is 8 and the ordering information ORD is 001 (see FIG. 4B), the 128 data d0 to d127 are ordered in order of D1, D2, D3, D0, D5, D6, D7, and D4, and supplied to the switching unit 220. Since the bit structure information BO is ×16, and the burst length information BL is 8, the switching unit 220 selects all of the 128 data d0 to d127 that are input in parallel to each other and outputs D1, D2, D3, D0, D5, D6, D7, and D4 through 16 data input/output pins (not shown).

Next, an embodiment of the operation of the CRC code generating unit 301 will be described.

As described above, while the data processing unit 200 is processing the 128 data d0 to d127 that are read, the CRC code generating unit 301 generates CRC codes CRC[0] to CRC[7] by using the 128 data d0 to d127 and the input/output mode information BL, ORD, and BO. That is, when the burst length information BL is 8, the ordering information ORD is 001, and the bit structure information BO is ×16, a dividend can be regarded as d16~d63d0~d15d80~d127d64~d790~0. Since the data d16, d24, and d33 when the ordering information ORD is 001 replaces the data d0, d8, and d17 from when the ordering information ORD was 000, the lowest significant bit CRC[0] of the CRC code is determined as a sum of the data d16, d24 and d33. Further, since, the data d17, d47, and d79 when the information ORD is 001 replaces the data d1, d31, and d127 from when the ordering information ORD was 000, the highest significant bit CRC[7] of the CRC code is determined as a sum of the data d17, d47, and d79.

Therefore, when the burst length information BL is 8, when the ordering information ORD is 001, and the bit structure information BO is ×16, the CRC codes CRC[0] to CRC[7] are determined as described above. As shown in FIG. 5B, the first selecting signal generating unit 311_1 outputs selecting signals CS0_16, CS0_24, and CS0_33 at a high level and the other selecting signals (the rest) at a low level. The seventh selecting signal generating unit 311_7 outputs selecting signals CS7_17, CS7_47, and CS7_79 at a high level and the other selecting signals (the rest) at a low level.

When the selecting signals are supplied from the first to seventh selecting signal generating units 311_1 to 311_7, as shown in FIG. 5C, predetermined data is selected from among the 128 data d0 to d127 and supplied to the first to seventh adding units 331_1 to 331_7. That is, the first selecting unit 321_1 receives the selecting signals CS0_0, CS0_16, CS0_24, CS0_33, and CS0_127, and the 128 data d0 to d127 and selects the data d16, d24, and d33. The seventh selecting signal generating unit 321_7 receives the selecting signals CS7_0, CS7_17, CS7_47, CS7_79, and CS7_127, and the 128 data d0 to d127 and selects the data d17, d47, and d79. The first or seventh selecting unit 321_1 or 321_7 can include, for example, an AND gate, and select data d16, d24, and d33 or d17, d47, and d79 according to the selecting signals CS0_16, CS0_24, and CS0_33 or CS7_17, CS7_47, and CS7_79.

The first adding unit 331_1 adds the data d16, d24, and d33 that are selected by the first selecting unit 321_1, and outputs the lowest significant bit CRC[0] of the CRC code. The seventh adding unit 331_7 adds the data d17, d47, and d79 that are selected by the seventh selecting unit 321_7, and outputs the highest significant bit CRC[7] of the CRC code.

Figure 6B:
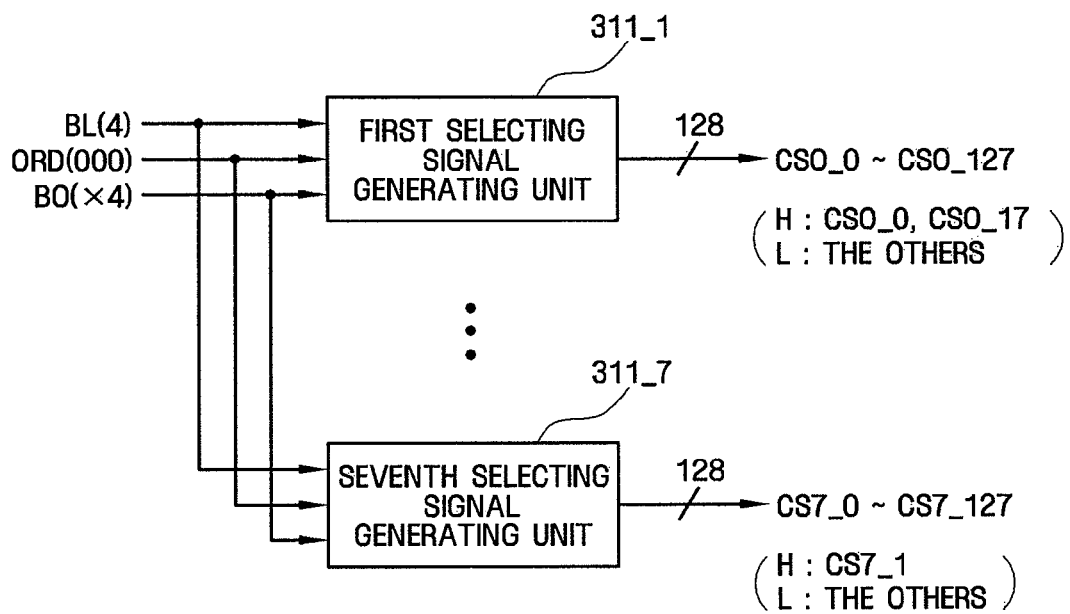
FIG. 6B is a block diagram illustrating embodiments of selecting signal generating units according to the third input/output mode information.
Figure 6C:
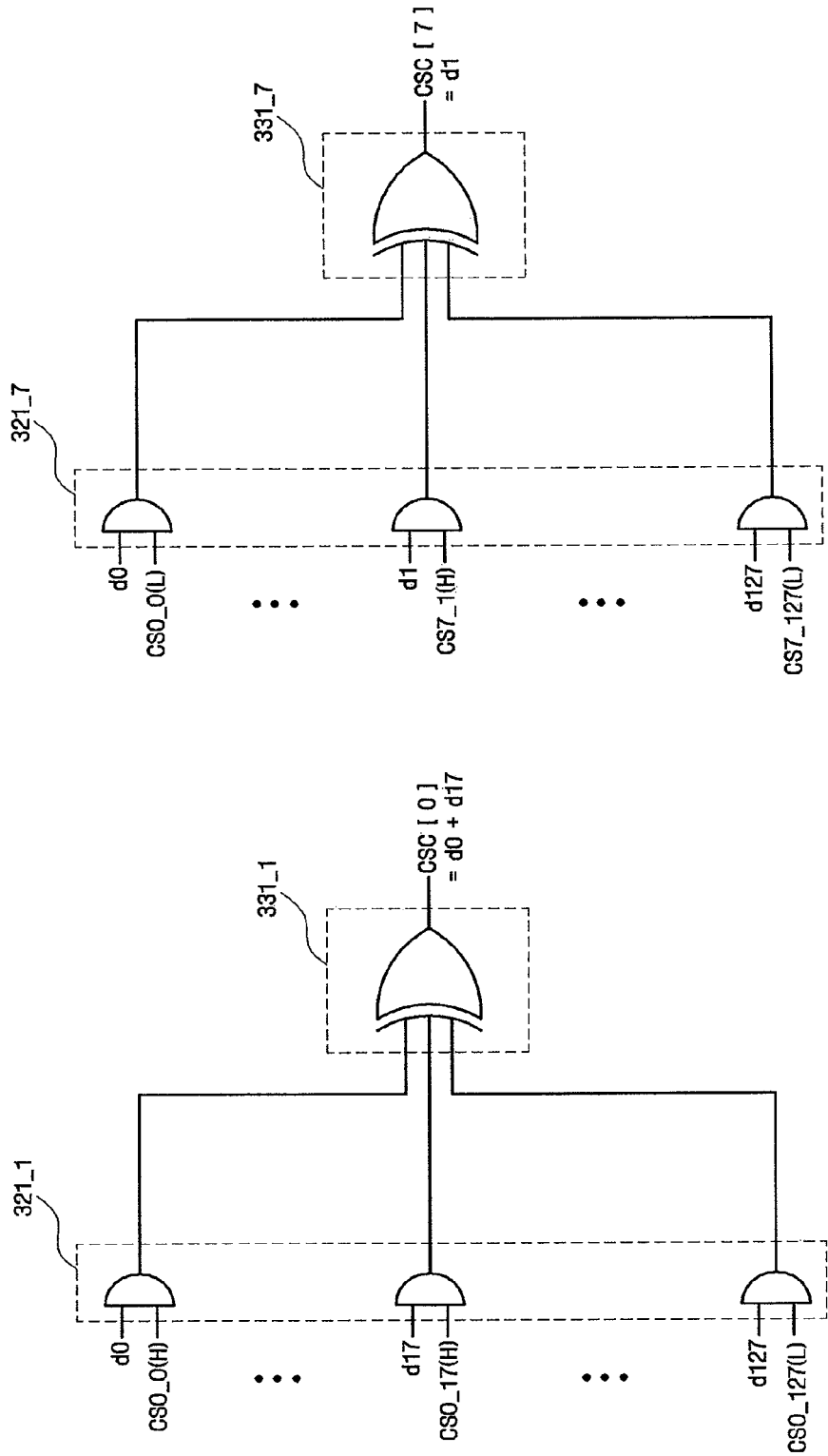
FIG. 6C is a block diagram illustrating embodiments of selecting units and adding units according to the third input/output mode information.

Next, an embodiment of the operation of the semiconductor memory device will be described in detail with reference to FIGS. 1, 6A to 6C on the assumption that, as third input/output mode information, burst length information BL is 4, ordering information ORD is 000, and bit structure information BO is ×8. FIG. 6A is a view illustrating the operation of the semiconductor memory device according to third input/output mode information. FIG. 6B is a block diagram illustrating selecting signal generating units according to the third input/output mode information. FIG. 6C is a block diagram illustrating selecting units and adding units according to the third input/output mode information. For the convenience of explanation, the description will be made of a case in which the check code generating unit 3001 of FIG. 1 is a CRC code generating unit, e.g., CRC code generating unit 301 as in FIG. 3. Further, parts having the same functions as those in the above-described embodiment FIGS. 4A to 4D are represented by the same reference numerals, and thus the descriptions thereof will be omitted here.

First, the operation of the data processing unit 200 will be described.

The maximum number of data channels can be 128 (the number of channels in FIG. 1, n: 128) in consideration of a case in which burst length is 8 and a bit structure is ×16. Since the burst length information BL 4, 64 data are read. The ordering unit 210 orders 64 data d0 to d63 according to the burst length information BL and the ordering information ORD. Since the burst length is 4 and the ordering information ORD is 000 (see FIG. 4B), the 64 data d0 to d63 are ordered in order of D0, D1, D2, and D3 and supplied to the switching unit 220. The switching unit 220 can select and output the data above a dotted line in FIG. 6A from among the 64 data d0 to d63, because the bit structure information BO is ×8 and the burst length information BL is 4.

Next, the operation of the CRC code generating unit 301 will be described.

As described above, while the data processing unit 200 is processing the 64 data d0 to d63 that are read, the CRC code generating unit 301 generates a CRC code by using the 64 data d0 to d63 and the input/output mode information BL, ORD, and BO.

That is, when the burst length information BL is 4, the ordering information ORD is 000, and the bit structure information BO is ×8, a dividend can be regarded as d0~d70~0d16~d230~0d32~d390~0d48~d550~00~0, as shown in FIG. 6A for D0 to D7, respectively. Here, data that is not selected and data that is not read can be regarded as 0. This is because the receiving unit for the data can receive the 64 data d0 to d63, and detect whether or not errors have occurred by recognizing that the data in the form of a dividend is transmitted.

In this case, the data d0, 0, d17 when the burst length information BL is 4 and the bit structure information BO is ×8 replaces the data d0, d8, and d17 from when the burst length information BL was 8 and the bit structure information BO was ×16 (see FIG. 4A), the lowest significant bit CRC[0] of the CRC code is determined as a sum of the data d0 and d17. Further, the data d1 and 0 when the burst length information BL is 4 and the bit structure information BO is ×8 replaces the data d1, d31, and d127 from when the burst length information BL was 8 and the bit structure information BO was ×16 (see FIG. 4A), the highest significant bit CRC[7] of the CRC code is determined as the data d1.

Therefore, when the burst length information BL is 4, the ordering information ORD is 000, and the bit structure information BO is ×8, the CRC code CRC[0] to CRC[7] is determined as described above. As shown in FIG. 6B, the first signal generating 311_1 outputs selecting signals CS0_0 and CS0_17 at a high level and the other selecting signals (the rest) at a low level. The seventh selecting signal generating unit 311_7 outputs a selecting signal CS7_1 at a high level and the other selecting signals at a low level.

When the selecting signals are supplied from the first to seventh selecting signal generating units 311_1 to 311_7, predetermined data is selected from among the 64 data d0 to d63, and supplied to the first to seventh adding units 331_1 to 331_7. Here, the number of data d0 to d63 that is read is 64, but there are 128 data channels. Since the rest of the 64 data channels can be in a floating state, it is assumed that data is also read in the 64 data channels, but the 64 data channels are not selected. That is, the first selecting unit 321_1 receives the selecting signals CS0_0, CS0_17, and CS0_127, and the 128 data d0 to d127 and selects the data d0 and d17. The seventh selecting unit 321_7 receives the selecting signals CS7_0, CS7_1, and CS7_127 and the 128 data d0 to d127, and selects the data d1.

The first adding unit 331_1 adds the data d0 and d17 that are selected by the first selecting unit 321_1, and outputs the lowest significant bit CRC[0] of the CRC code. The seventh adding unit 331_7 outputs the data d1 that is selected by the seventh selecting unit 321_7 as the highest significant bit CRC[7] of the CRC code.

In brief, as described above, with respect to one divisor, each of the bits of the CRC codes CRC[0] to CRC[7] is determined as the sum of predetermined data by a combination of the burst length information BL, the ordering information ORD, and bit structure information BO. Therefore, some of the data is selected from the read data by the combination of the burst length information BL, the ordering information ORD, and the bit structure information BO, and the selected data is added to thereby generate the CRC code CRC[0] to CRC[7]. The selecting signal generating units 311_1 to 311_$k$, which select some of the data from among the read data, output selecting signals for selecting predetermined data by the combination of the burst length information BL, the ordering information ORD, and the bit structure information BO. The selecting signal generating unit 311_1 to 311_7 can be realized by combining logic gates, as will be appreciated by those skilled in the art. Further, the above-described selecting units 321_1 to 321_7 are not necessarily formed of 128 AND gates, as will be appreciated by those skilled in the art. Further, the CRC code generating unit can be arranged in the semiconductor memory device at various positions.

According to the semiconductor memory device, while the data processing unit 200 is processing data, the CRC check code CRC[0] to CRC[7] is generated. Therefore, additional time is not required to generate the CRC code CRC[0] to CRC[7], such that reliability of data can be ensured while the operating speed of the semiconductor memory device is not reduced.

Figure 7:
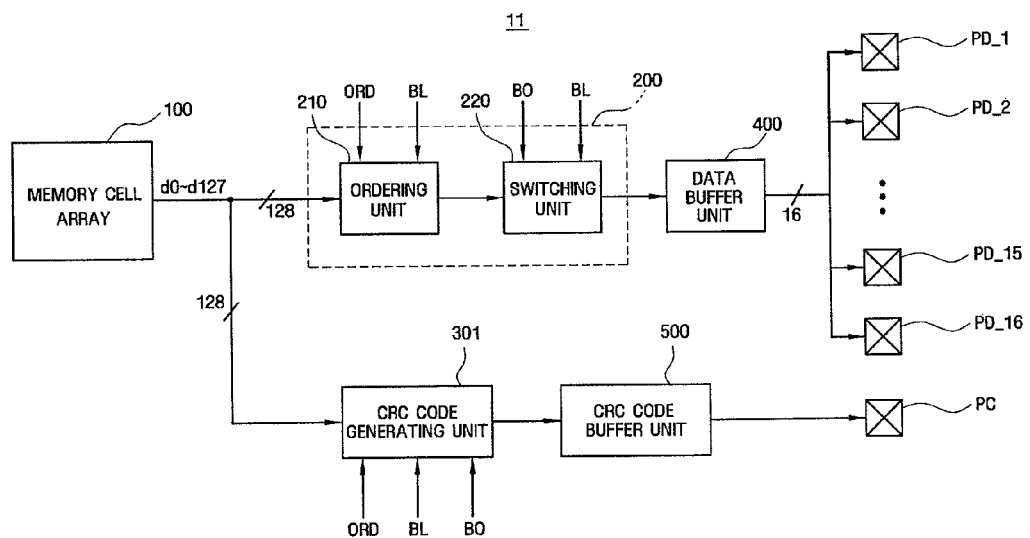
FIG. 7 is a block diagram illustrating another embodiment of a semiconductor memory device and a method of driving the same according to another aspect of the present invention.
Figure 8:
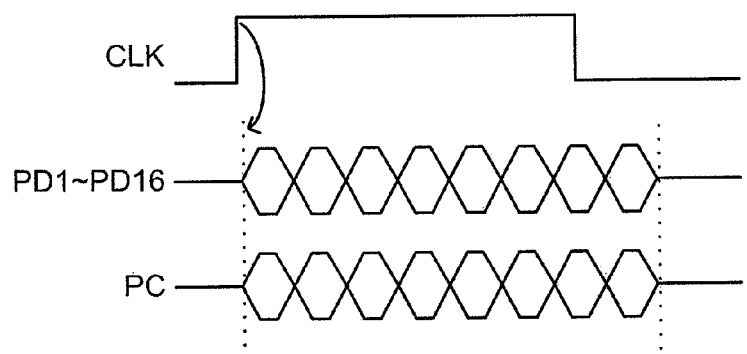
FIG. 8 is a timing diagram illustrating output of data and a CRC code.

Another embodiment of a semiconductor memory device and a method of driving the same according to another aspect of the present invention will be described with reference to FIGS. 7 and 8. FIG. 7 is a block diagram illustrating an embodiment of a semiconductor memory device 11, which is useful in describing an embodiment of a method of driving the same according to another aspect of the present invention. FIG. 8 is a timing diagram illustrating output of data and a CRC code. In this embodiment, the description will be made of a case in which there are 128 data channels, burst length information is 8, and bit structure information is ×16, and a CRC code has 8 bits.

Semiconductor memory device 11 includes a memory cell array 100, ordering unit 210, switching unit 220 and CRC code generating unit 301 described above, and further includes a data buffer unit 400, a CRC code buffer unit 500, data output pins PD_1 to PD_16, and a CRC code pin PC.

As described above, while the data processing unit 200 is processing data, the CRC code generating unit 301 generates the CRC code. The processed data is output by the data buffer unit 400 through the individual data output pins PD_1 to PD_16. The generated CRC code is output by the CRC code buffer unit 500 through the CRC code pin PC. At this time, as shown in FIG. 8, the data and the CRC code can be output at the same time. Further, when the number of bits of the data that is output through each of the output pins PD_1 to PD_16, that is, burst length and the number of bits of the CRC code are the same, or when the number of bits of the CRC code is smaller than the burst length, the CRC code is output while the data is being output (see FIG. 8). Therefore, additional time is not required to transmit the CRC code. That is, the operating speed of the semiconductor memory device is not reduced and reliability of the data can be ensured.

Figure 9:
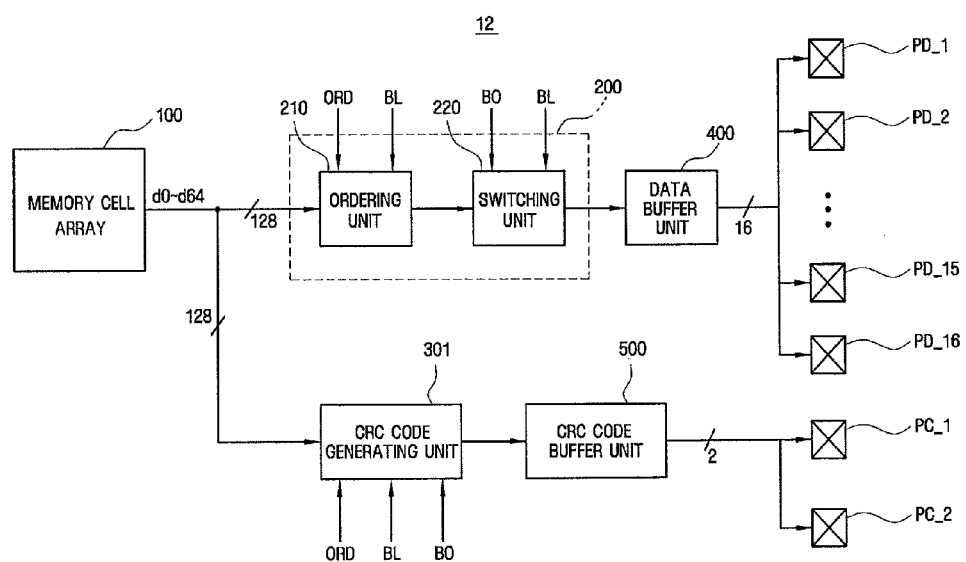
FIG. 9 is a block diagram illustrating still another embodiment of a semiconductor memory device according to still another aspect of the present invention.

Another embodiment of a semiconductor memory device and a method of driving the same according to still another aspect of the present invention will be described with reference to FIG. 9. FIG. 9 is a block diagram illustrating a semiconductor memory device 12 according to this embodiment of the present invention. In this embodiment, the description will be made of a case in which there are 128 data channels, burst length information is 4, bit structure information ×16, and the CRC code has 8 bits.

Semiconductor memory device 12 includes a memory cell array 100, ordering unit 210, switching unit 220, CRC code generating unit 301, and data buffer unit 400, a CRC code buffer unit 500, data output pins PD_1 to PD_16) described above, and further includes CRC code pins PC_1 and PC_2.

As described above, the data and the CRC code can be output at the same time. When the number of bits of data that is output through each of the output pins PD_1 to PD_16, that is, the burst length is smaller than the number of bits of the CRC code, that is, when the burst length is 4 and the CRC code has 8 bits, each of the four bits of the CRC code are output through each of the two CRC code pins PC_1 and PC_2. Therefore, the CRC code is transmitted while the data is being output. Accordingly, additional time is not required to transmit the CRC code. That is, it is possible to ensure reliability of data while the operating speed of the semiconductor memory device is not reduced.

Although the present invention has been described in connection with the exemplary embodiments in accordance with the present invention, it will be apparent to those skilled in the art that various modifications and changes can be made thereto without departing from the scope and spirit of the invention. Therefore, it should be understood that the above embodiments are not limitative, but illustrative in all aspects. It is intended by the following claims to claim that which is literally described and all equivalents thereto, including all modifications and variations that fall within the scope of each claim.

What is claimed is:

1. A cyclic redundancy check code generating circuit comprising:
   selecting signal generating units configured to supply selecting signals corresponding to input/output mode information;
   selecting units configured to receive the selecting signals from the selecting signal generating units, to receive input data, and to select some of the input data based on the selecting signals; and
   adding units configured to add the selected data and to generate individual bits of a cyclic redundancy check code.

2. The cyclic redundancy check code generating circuit of claim 1, wherein the input/output mode information comprises ordering information, bit structure information, and burst length information of the semiconductor memory device.

3. The cyclic redundancy check code generating circuit of claim 2, wherein:
   each of the selecting units comprises an AND gate that receives the selecting signals and the data, and
   each of the adding units comprises an exclusive OR gate (XOR) that receives an output of the AND gate and adds that output to the selected data.

4. The cyclic redundancy check code generating circuit of claim 1, wherein the input data is read data.

5. The cyclic redundancy check code generating circuit of claim 1, wherein the input data is write data.

6. The cyclic redundancy check code generating circuit of claim 1, wherein there are k selecting signal generating units, k selecting units, and k adding units, wherein k is an integer greater than 1.

7. The cyclic redundancy check code generating circuit of claim 6, wherein each of the k selecting signal generating units is connected to a corresponding one of the k selecting units.

8. The cyclic redundancy check code generating circuit of claim 7, wherein each of the k selecting units is connected to a corresponding one of the k adding units.

* * * * *

UNITED STATES PATENT AND TRADEMARK OFFICE
CERTIFICATE OF CORRECTION

| | |
|---|---|
| PATENT NO. | : 8,966,338 B2 |
| APPLICATION NO. | : 13/666560 |
| DATED | : February 24, 2015 |
| INVENTOR(S) | : Kyung-hyun Kim |

Page 1 of 1

It is certified that error appears in the above-identified patent and that said Letters Patent is hereby corrected as shown below:

In the Claims

In Claim 3, Column 14, Line number 22, Please insert --input-- before the word "data"

Signed and Sealed this
Second Day of June, 2015

Michelle K. Lee
*Director of the United States Patent and Trademark Office*